(12) United States Patent
Lee et al.

(10) Patent No.: US 9,082,910 B2
(45) Date of Patent: Jul. 14, 2015

(54) SOLAR CELL AND MANUFACTURING METHOD THEREOF

(75) Inventors: Jung-Ho Lee, Ansan (KR); Jin-Young Jung, Ansan (KR); Sang-Won Jee, Ansan (KR); Han-Don Um, Ansan (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 320 days.

(21) Appl. No.: 13/380,584

(22) PCT Filed: Oct. 14, 2009

(86) PCT No.: PCT/KR2009/005916
§ 371 (c)(1),
(2), (4) Date: Dec. 23, 2011

(87) PCT Pub. No.: WO2010/150947
PCT Pub. Date: Dec. 29, 2010

(65) Prior Publication Data
US 2012/0097231 A1   Apr. 26, 2012

(30) Foreign Application Priority Data
Jun. 25, 2009 (KR) .................. 10-2009-0056908

(51) Int. Cl.
*H01L 31/0352* (2006.01)
*H01L 31/0236* (2006.01)
(Continued)

(52) U.S. Cl.
CPC ...... *H01L 31/035281* (2013.01); *H01L 31/028* (2013.01); *H01L 31/0236* (2013.01); *H01L 31/068* (2013.01); *H01L 31/1804* (2013.01); *Y02E 10/52* (2013.01); *Y02E 10/547* (2013.01)

(58) Field of Classification Search
CPC ............... H01L 31/035277; H01L 31/035281; H01L 31/0236; H01L 31/02363
USPC ......................................... 136/243, 244, 250
See application file for complete search history.

(56) References Cited

U.S. PATENT DOCUMENTS

2006/0207647 A1* 9/2006 Tsakalakos et al. .......... 136/256
2008/0006319 A1   1/2008 Bettge et al.
(Continued)

OTHER PUBLICATIONS

Jin-Young Jung et al., Photovoltaic Application of Radial p-n Junction Silicon Wire Arrays Prepared by Metal-induced Electroless Etching with Conformal Doping, Three-Dimensional Architectures for Energy Generation and Storage, Hanyang University Semiconductor Nano-processing Lab, 2009 MRS spring meeting, Apr. 13-17, 2009, San Francisco, CA.
(Continued)

*Primary Examiner* — Jeffrey T Barton
*Assistant Examiner* — Meisha Binkley
(74) *Attorney, Agent, or Firm* — Lexyoume IP Meister, PLLC

(57) ABSTRACT

A solar cell includes: a substrate; a plurality of first nanostructures provided on the substrate and arranged; and a plurality of second nanostructures provided on the substrate and arranged separate from the plurality of first nanostructures wherein an average diameter of a cross section of one of the plurality of first nanostructures that is incised in a direction that is in parallel to a substrate surface of the substrate is greater than an average diameter of a cross section of one of the plurality of second nanostructures that is incised in a direction that is in parallel to a substrate surface of the substrate.

15 Claims, 9 Drawing Sheets

(51) Int. Cl.
*H01L 31/028* (2006.01)
*H01L 31/068* (2012.01)
*H01L 31/18* (2006.01)

(56) References Cited

U.S. PATENT DOCUMENTS

2008/0135089 A1   6/2008   Tsakalakos et al.
2008/0178924 A1   7/2008   Kempa et al.
2009/0194160 A1*  8/2009   Chin et al. .................. 136/256
2009/0261353 A1* 10/2009   Gaebler et al. ................. 257/82
2010/0116333 A1*  5/2010   Ponce et al. .................. 136/256

OTHER PUBLICATIONS

Lee, Gi-Hwan et al., Photovoltaic cell having semiconductor rod, method for fabricating the cell, and unified module of photovoltaic cell—thermoelectric device, Technology Transfer Presentation, New Power for Green Growth, Samsung Coex Intercontinental Hotel, (Apr. 27, 2009).

* cited by examiner

SOLAR CELL AND MANUFACTURING METHOD THEREOF

BACKGROUND OF THE INVENTION

The present invention relates to a solar cell and a manufacturing method thereof. Particularly, the present invention relates to a solar cell for improving efficiency of photoelectric conversion and efficiency of light absorption by forming a plurality of nanostructures with different structures together, and a manufacturing method thereof.

Recently, research and development of clean energy has been vigorously conducted due to depletion and increasing prices of resources. Examples of the clean energy include solar energy, wind energy, tidal energy, and so on. Particularly, research and development for effectively using solar energy to conserve resources has been vigorously conducted.

A solar cell represents a device for converting sunlight energy into electrical energy. When the sunlight is applied to the solar cell, electrons and holes are generated by the solar cell. The electrons and the holes move to the P pole and the N pole included in the solar cell, and a potential difference occurs between the P pole and the N pole to flow a current.

SUMMARY OF THE INVENTION

Technical Problem

The present invention has been made in an effort to provide a solar cell for improving efficiency of photoelectric conversion and efficiency of light absorption by forming a plurality of nanostructures with different structures together. The present invention has been made in another effort to provide a method for manufacturing the solar cell.

Technical Solution

An exemplary embodiment of the present invention provides a solar cell including: a substrate; a plurality of first nanostructures provided on the substrate and arranged; and a plurality of second nanostructures provided on the substrate and arranged separate from the plurality of first nanostructures. An average diameter of a cross-section of one of the plurality of first nanostructures that is incised in a direction that is in parallel to a substrate surface of the substrate is greater than an average diameter of a cross-section of one of the plurality of second nanostructures that is incised in a direction that is in parallel to a substrate surface of the substrate.

The first nanostructure includes a first doping area, and a second doping area surrounding the first doping area in a substrate surface direction of the substrate. A diameter of a cross-section of the second nanostructure that is incised in a substrate surface direction of the substrate becomes greater as the cross-section approaches the substrate surface of the substrate. The second doping area is formed to be conformal.

The plurality of the first nanostructures are arranged regularly. Distances of the plurality of first nanostructures are 6 μm to 8 μm. A height of one the plurality of first nanostructures is 5 μm to 100 μm. A number of the plurality of second nanostructures is greater than a number of the plurality of first nanostructures. A diameter of the first nanostructure is 1000 nm to 2000 nm. A diameter of the second nanostructure is 10 nm to 100 nm.

The plurality of first nanostructures and the plurality of second nanostructures include silicon. A sum of surface areas of the plurality of second nanostructures is greater than a sum of surface areas of the plurality of first nanostructures.

The solar cell according to an embodiment of the present invention further includes an insulator formed in a separated space of the plurality of first nanostructures and the plurality of second nanostructures. The solar cell according to an embodiment of the present invention further includes an electrode provided on the insulator. Tops of the plurality of first nanostructures and tops of the plurality of second nanostructures contact the electrode and are electrically connected to the electrode.

Another embodiment of the present invention provides a method for manufacturing a solar cell, including: providing a base material; forming a mask layer in which a plurality of openings are formed on the base material; providing nanometal particles on the base material exposed through the openings; providing a plurality of first nanostructures and a plurality of second nanostructures by etching the base material; and forming a doping area in the plurality of first nanostructures. In the providing of a plurality of first nanostructures and a plurality of second nanostructures, a diameter of a cross-section of the second nanostructure that is incised in a substrate surface direction of the substrate becomes greater as the cross-section approaches the substrate surface of the substrate.

In the providing of a plurality of the first nanostructures and a plurality of the second nanostructures, the plurality of first nanostructures are formed at the bottom of the mask layer. In the providing of a plurality of first nanostructures and a plurality of second nanostructures, the plurality of second nanostructures are formed at the bottom of the nanometal particles.

In the providing of nanometal particles, the nanometal particles include silver. In the providing of a plurality of first nanostructures and a plurality of second nanostructures, the base material is etched with potassium hydroxide. The forming of a plurality of first nanostructures in a doping area includes: performing a spin-on doping (SOD) process on the plurality of first nanostructures; and performing a plasma ion doping (PID) process on the spin-on doped first nanostructures. The plurality of first nanostructures are doped to be n type or p type.

In the providing of the base material, the base material includes p-type silicon. The method further includes providing a back surface field layer on a rear of the base material wherein a back surface field layer is provided when a doping area is formed in the plurality of first nanostructures.

The method further includes providing an insulator in a separated space of the plurality of first nanostructures and the plurality of second nanostructures. The method further includes providing an electrode on the insulator. Tops of the plurality of first nanostructures and tops of the plurality of second nanostructures contact the electrode and are electrically connected thereto.

Advantageous Effect

The efficiency of photoelectric conversion and the efficiency of light absorption of the solar cell can be improved by forming the nanostructure with different structures together. Further, the solar cell with excellent energy efficiency can be easily manufactured.

DETAILED DESCRIPTION OF THE EMBODIMENTS

Figure 1:
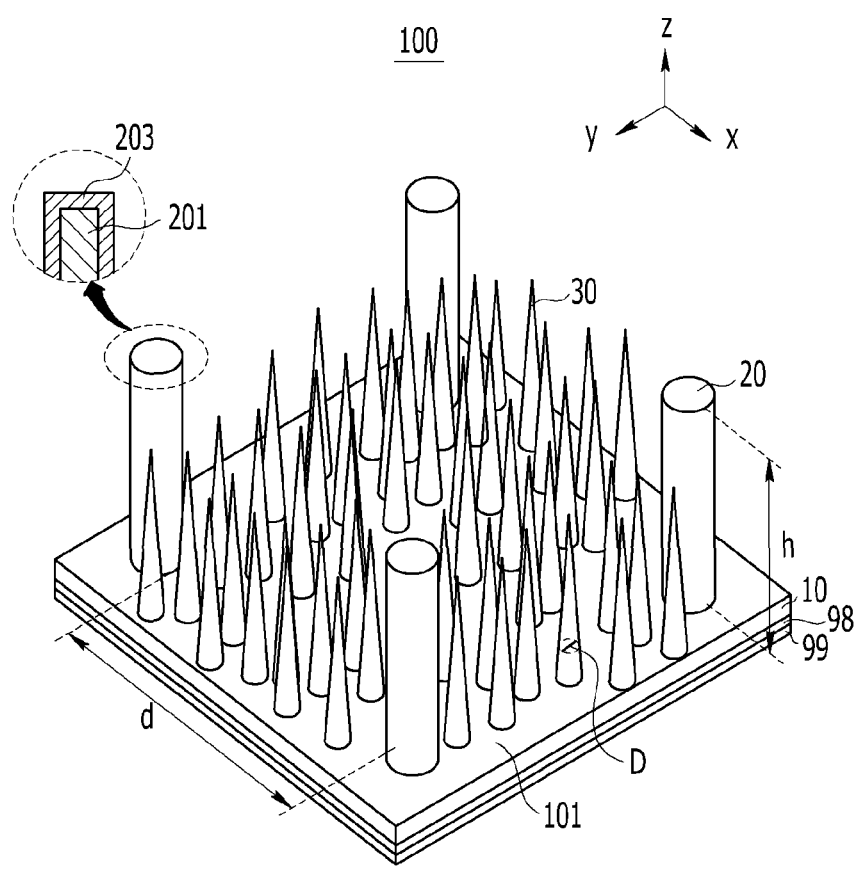
FIG. 1 shows a perspective view of a solar cell according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. It will be understood that when an element is referred to as being "on" another element, it can be directly on another element or intervening elements may be present therebetween. In contrast, when an element is referred to as being "directly on" another element, there are no intervening elements therebetween.

It will be understood that, although the terms first, second, third, etc. may be used herein to describe various elements, components, regions, layers and/or sections, but are not limited thereto. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The technical terms used herein are to simply mention a particular exemplary embodiment and are not meant to limit the present invention. An expression used in the singular encompasses the expression of the plural, unless it has a clearly different meaning in the context. In the specification, it is to be understood that the terms such as "including" or "having" etc., are intended to indicate the existence of specific features, regions, numbers, stages, operations, elements, components, or combinations thereof disclosed in the specification, and are not intended to preclude the possibility that one or more other specific features, regions, numbers, operations, elements, components, or combinations thereof may exist or may be added.

Spatially relative terms, such as "below", "above", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the drawings. For example, if the device in the figures is turned over, elements described as "below" other elements or features would then be oriented "above" the other elements or features. Thus, the exemplary term "below" can encompass both an orientation of above and below. Devices may be otherwise rotated 90 degrees or at other angles and the spatially relative descriptors used herein interpreted accordingly.

Unless otherwise defined, all terms used herein, including technical or scientific terms, have the same meanings as those generally understood by those with ordinary knowledge in the field of art to which the present invention belongs. Such terms as those defined in a generally used dictionary are to be interpreted to have the meanings equal to the contextual meanings in the relevant field of art, and are not to be interpreted to have idealized or excessively formal meanings unless clearly defined in the present application.

Exemplary embodiments of the present invention described with reference to perspective views and cross-sectional views represent in detail ideal exemplary embodiments of the present invention. Resultantly, various modifications of diagrams, for example modifications of manufacturing methods and/or specifications, are expected. Accordingly, exemplary embodiments are not limited to specific shapes of shown regions, and for example, also include modifications of the shape by manufacturing. For example, regions shown or described to be flat generally may have rough or rough and nonlinear characteristics. Further, portions shown to have sharp angles may be rounded. Therefore, the regions shown in the drawings are basically just schematic and the shapes of those are not intended to show the exact shapes of the region and are also not intended to reduce the scope of the present invention.

The term nano described in the specification represents a nano scale and it may include a micro unit. Also, the nanostructure described in the specification signifies a nano-style object including all structures such as a nanorod, a nanotube, a nanowall and a nanowire.

FIG. 1 shows a perspective view of a solar cell 100 according to an exemplary embodiment of the present invention. A magnified circle of FIG. 1 shows a cross-section of a first nanostructure 20 included in the solar cell 100 with respect to the y-axis direction. A configuration of the solar cell 100 shown in FIG. 1 exemplifies the present invention to which the present invention is not restricted. Hence, the configuration of the solar cell 100 is variable in other forms.

As shown in FIG. 1, the solar cell 100 includes a substrate 10, first nanostructures 20, and second nanostructures 30. The solar cell 100 can further include other necessary elements. For example, the solar cell 100 further includes a back surface field (BSF) layer 98 and an electrode 99 formed below the substrate 10. The back surface field layer 98 is p-type doped in a high concentration to increase transfer efficiency of holes and increase the efficiency of photoelectric conversion of the solar cell 100.

Although not shown in FIG. 1 for convenience, a space between the first nanostructures 20 and the second nanostructures 30 can be charged with a dielectric material and a transparent conductive oxide (TCO). The transparent conductive oxide is provided on the dielectric material and is connected to an electrode (not shown). Sunlight can be applied into the solar cell 100 through the transparent conductive oxide.

As shown in FIG. 1, the solar cell 100 includes the first nanostructures 20 and the second nanostructures 30 with different configurations so they have the advantages of both the first nanostructures 20 and the second nanostructures 30. That is, the efficiency of photoelectric conversion of the solar cell 100 is increased by using the first nanostructures 20 and the rate of light absorption of the solar cell 100 can be improved by using the second nanostructures 30. Therefore, the substrate 10 made of a low-price material such as silicon is usable for the solar cell 100.

An average diameter of the cross-section of the first nanostructure 20 incised in a direction that is parallel to a substrate surface 101 of the substrate 10, that is, the direction of the xy plane, is greater than an average diameter of the cross-section of the second nanostructure 30 incised in the direction of the xy plane. That is, the first nanostructures 20 are larger than the second nanostructures 30. Therefore, the solar cell 100 with excellent efficiency and low price can be manufactured by using the first nanostructures 20 and the second nanostructures 30.

As shown in FIG. 1, the first nanostructures 20 are provided on the substrate 10. The first nanostructures 20 are arranged with gaps therebetween. The second nanostructures 30 are distanced from the first nanostructures 20 and are provided on the substrate 10. The first nanostructures 20 can be arranged on the substrate 10 according to a predetermined rule. Hence, the first nanostructures 20 support the solar cell 100 and improve durability of the solar cell 100.

The distances (d) of the first nanostructures 20 can be 6 μm to 8 μm. When the distances (d) of the first nanostructures 20 are very much less, a space for forming the second nanostructures 30 is insufficient. Further, when the distances (d) of first nanostructures 20 are very much more, durability of the solar cell 100 is deteriorated.

A height (h) of the first nanostructure 20 can be 5 μm to 100 μm. When the height of the first nanostructure 20 is very much less, the rate of light absorption of the solar cell 100 is deteriorated. Also, when the height of the first nanostructure 20 is very much more, durability of the solar cell 100 is deteriorated.

The diameter of the first nanostructure 20 can be 1000 nm to 2000 nm. When the diameter of the first nanostructure 20 is very much less, a pn junction is not efficiently performed. Also, when the diameter of the second nanostructure 20 is very much more, integrity of the solar cell 100 cannot be improved. As described above, the first nanostructure 20 has a proper size thereby improving the durability of the solar cell 100 and realizing excellent photoelectric conversion efficiency.

Meanwhile, the diameter of the second nanostructure 30 can be 10 nm to 100 nm. When the diameter of the second nanostructure 30 is very much less, it is difficult to be supported on the substrate 10. Also, when the diameter of the second nanostructure 30 is very much more, surface areas of the second nanostructure 30 are reduced to deteriorate the rate of light absorption. Further, a sum of the surface areas of the second nanostructures 30 is greater than a sum of the surface areas of the first nanostructures 20 so that the second nanostructures 30 absorb much more sunlight than the first nanostructures 20. Particularly, a number of the second nanostructures 30 is greater than a number of the first nanostructures 20 so the absorption rate of sunlight can be increased by using the second nanostructures 30.

A diameter (D) of a cross-section of the second nanostructure 30 that is incised in a direction that is parallel to the substrate surface 101 of the substrate 10, that is, the xy plane, becomes greater as the cross-section approaches the substrate surface 101 of the substrate 10. For example, the second nanostructure 30 is formed to be a cone.

The above-formed second nanostructure 30 has a graded refractive index and a multi-band gap so it has an excellent light absorption rate. In further detail, the second nanostructure 30 has a graded refractive index so it reduces Rayleigh scattering and minimizes the sunlight reflection rate. Further, the second nanostructure 30 has an extrinsic size effect because of its form so it has an excellent light absorption rate in an area that is above the near infra-red NIR area because of the band gap modulation effect. The band gap of the second nanostructure 30 is 0.6 eV to 1.1 eV.

As shown by the enlarged circle of FIG. 1, the first nanostructure 20 includes a first doping area 201 and a second doping area 203. The second doping area 203 surrounds the first doping area 201 in a direction that is parallel to the substrate surface 101 of the substrate 10, that is, the direction of the xy plane. In this instance, the second doping area 203 is formed to be an n type and the first doping area 201 is formed to be a p type. Therefore, the electrons are combined with the first doping area 201 and the holes are combined with the second doping area 203 by the applied sunlight thereby generating an electromotive force.

Differing from this, the second doping area 203 can be formed to be a p type and the first doping area 201 can be formed to be an n type. For example, the n-type silicon nanowire is manufactured and the above-configured first nanostructure 20 can then be manufactured through p-type doping.

In this instance, the second doping area 203 can be formed to be conformal. That is, the second doping area 203 is formed to have an n-type doping concentration inclination. Therefore, the photoelectric conversion efficiency caused by a pn junction of the first doping area 201 and the second doping area 203 of the first nanostructure 20 can be substantially increased. Particularly, the first nanostructure 20 is relatively big so efficient pn junction is performed to further increase the photoelectric conversion of the solar cell 100.

Figure 2:
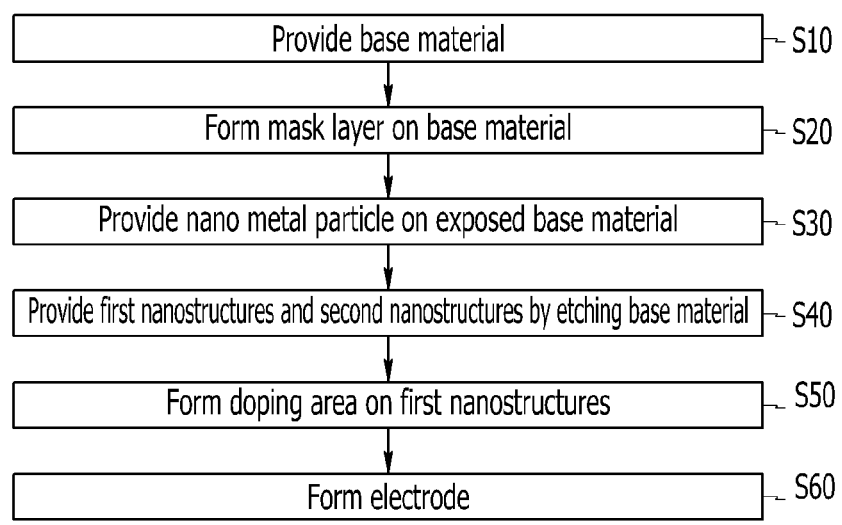
FIG. 2 shows a flowchart of a process for manufacturing a solar cell shown in FIG. 1.

FIG. 2 shows a flowchart of a process for manufacturing a solar cell shown in FIG. 1, and FIG. 3 to FIG. 10 show a process for manufacturing a solar cell corresponding to respective stages of FIG. 2. A process for manufacturing a solar cell 100 will now be sequentially described with reference to FIG. 2 and FIG. 3 to FIG. 10.

In S10 of FIG. 2, a base material 12 (shown in FIG. 3) is provided. The base material 12 can be p-type silicon that has a crystallization direction of 001. Therefore, the production cost of the solar cell can be reduced by using the base material 12 made of a relatively cheap material.

Next, in S20 of FIG. 2, a mask layer 40 (shown in FIG. 4) with openings 401 is formed on the base material 12. The photoresist layer is formed on the base material 12 and is exposed and etched with a predetermined pattern to form the openings 401 in the mask layer 40.

Figure 5:
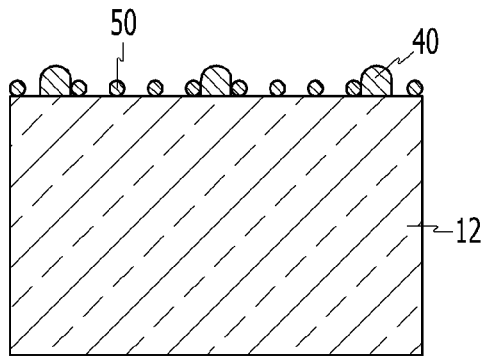

In S30 of FIG. 2, nanometal particles 50 are provided on the base material 12 exposed through the opening 401. That is, as shown in FIG. 5, for example, nanometal particles 50 such as silver can be deposited on the base material 12. That is, the base material 12 is inserted into a chamber (not shown), and the nanometal particles 50 made of silver can be deposited on the base material 12. Further, the silver can be deposited thereon by putting the base material 12 in an $AgNO_3$+HF solution.

Figure 6:
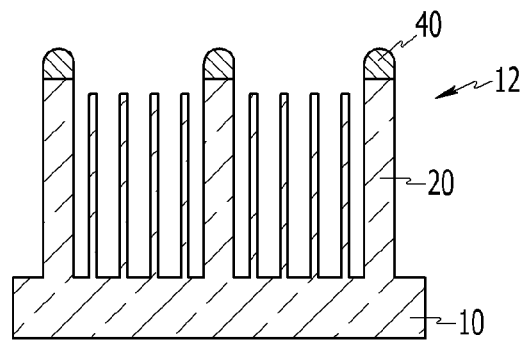

In S40 of FIG. 2, the base material 12 is etched. As shown in FIG. 6, the base material 12 undergoes electroless etching by inducement of the nanometal particles 50 (shown in FIG. 5). The base material 12 can be put into the solution of $HF+H_2O_2$ to be etched. In this case, the base material 12 at the bottom is etched to show a predetermined form by the nanometal particles 50. The remaining nanometal particles 50 can be removed by putting the base material 12 into nitric acid. As a result, as shown in FIG. 6, the substrate 10 and the first nanostructures 20 are formed. The first nanostructures 20 are formed at the bottom of the mask layer 40.

Figure 7:
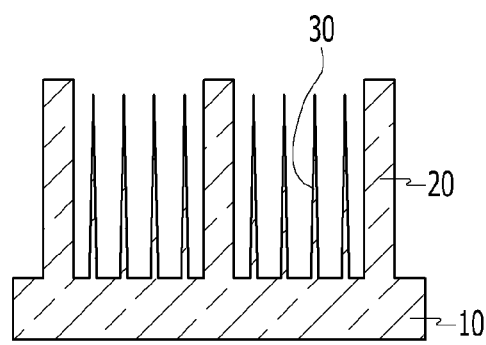

In this instance, when the base material 12 is etched by using a potassium hydroxide solution, the second nanostructures 30 in the form of a cone are formed and the mask layer 40 (shown in FIG. 6) is removed as shown in FIG. 7. The base material 12 is etched by the potassium hydroxide solution, the second nanostructures 30 that are condensed by the Van der Waals force are easily separated from each other, and the tops of the second nanostructures 30 are transformed to be pointed. As a result, the first nanostructures 20 and the second nanostructures 30 shown in FIG. 7 are provided. Here, the second nanostructures 30 are formed at the bottom of the nanometal particles 50 (shown in FIG. 5).

Figure 3:
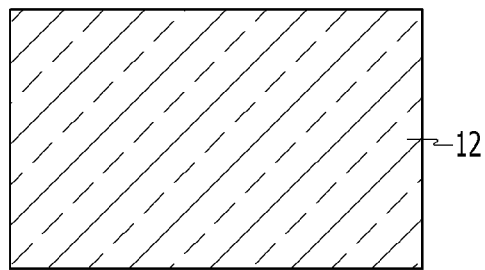
FIG. 3 to FIG. 10 show a process for manufacturing a solar cell corresponding to respective stages of FIG. 2.
Figure 4:
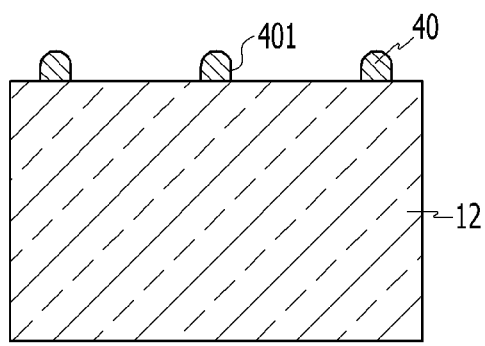
Figure 8:
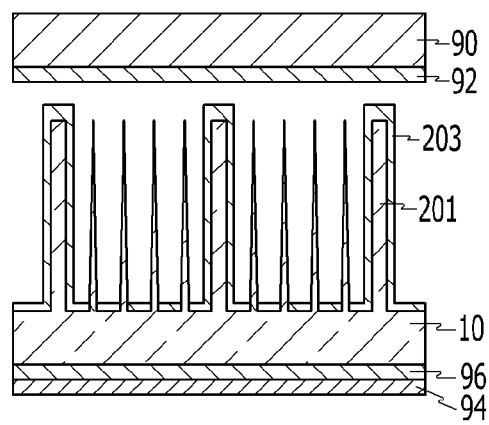

Next, in S50 of FIG. 3, a doping area is formed on the first nanostructure 20. That is, as shown in FIG. 8, phosphorus can be injected into the first nanostructure 20 by using a target source 92 that is attached to a source substrate 90 by spin-on doping (SOD). The phosphorus is spread to the first nanostructure 20 by a heat treatment to form an n-type doped region at the second doping area 203 outside the first nanostructure 20. Since the first doping area 201 is a p type, a pn junction is formed between the first doping area 201 and the second doping area 203. In addition, the second nanostructure 30 is doped but its diameter is less so that the entire second nanostructure 30 is formed to be an n type and a pn junction is formed between the second nanostructure 30 and the substrate 10.

Meanwhile, as shown in FIG. 8, another target source 96 disposed on a dummy substrate 94 can be provided on a rear side of the substrate 10. In this case, the first nanostructure 20 is doped and a back surface field layer 98 (shown in FIG. 9) can be provided on the rear of the substrate 10 by the spin-on doping method. The back surface field layer 98 is doped to be a high-concentration p-type doping area, that is, a +p type. Therefore, the first nanostructure 20 is doped and the back surface field layer 98 is formed by performing the heat treatment once, thereby reducing the process cost.

Figure 9:
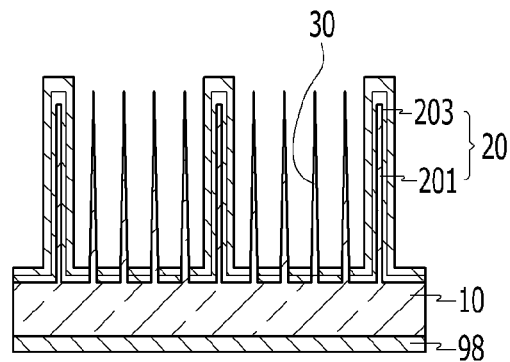

As shown in FIG. 9, the spin-on doped first nanostructure 20 can be formed to be a +n type by a plasma ion doping method. Hence, the second doping area 203 can be formed to be thin and conformal. That is, the second doping area 203 is formed to have an n-type concentration inclination.

Figure 10:
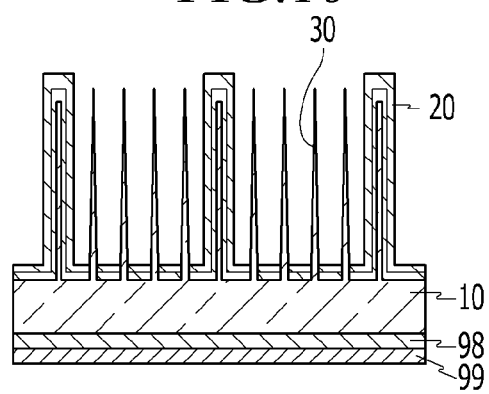

Finally, in S60 of FIG. 3, an electrode 99 is formed at the bottom of the back surface field layer 98. That is, as shown in FIG. 10, the electrode 99 can be formed at the bottom of the back surface field layer 98 by using an aluminum thin plate. For example, the aluminum thin plate can be attached to the back surface field layer 98 by using a melted mixture of silver paste and gallium indium (GaIn). A front surface field layer can also use the melted mixture of Ag paste and gallium indium (GaIn), and can also use a metal electrode that is sequentially deposited with Ti/Pd/Ag.

Figure 11:
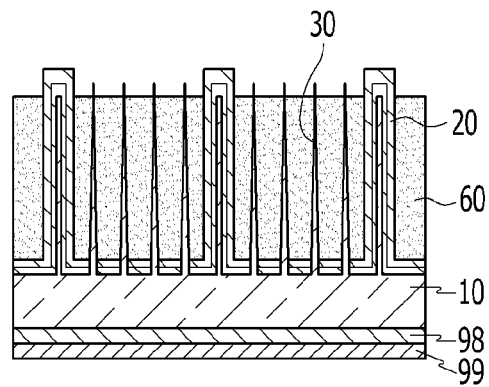
FIG. 11 and FIG. 12 show an additional process for manufacturing a solar cell.
Figure 12:
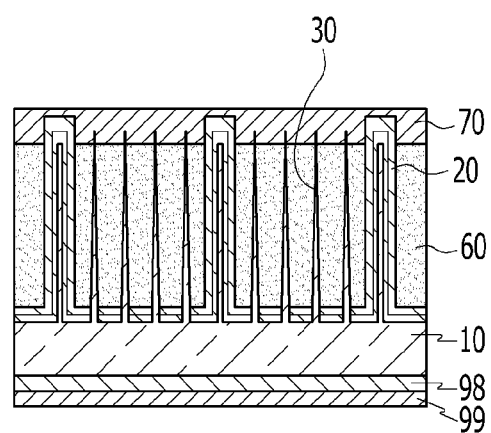

Although not shown in FIG. 3, the electrode can be formed by charging an insulation material into separated spaces of the first nanostructures 20 and the second nanostructures 30, and it can also be formed by exposing tops of the first nanostructures 20 and the second nanostructures 30. Referring to FIG. 11 and FIG. 12, the above-noted addition method will now be described in further detail.

FIG. 11 shows a state in which an insulator 60 is provided in a separated space of first nanostructures 20 and second nanostructures 30. In this instance, an insulating material used for the insulator 60 includes a transparent material such as polydimethylsiloxane (PDMS). When the separated space of the first nanostructures 20 and the second nanostructures 30 is filled by using the insulating material, the surfaces of the first nanostructures 20 and the second nanostructures 30 can be passivated. As a result, the photoelectric conversion of the first nanostructures 20 and the second nanostructures 30 is further increased.

Tops of the first nanostructures 20 and the second nanostructures 30 are exposed above the insulator 60, which is formed by spin coating a predetermined amount of insulating material. In addition, the first nanostructures 20 and the second nanostructures 30 are buried by using the insulating material, and the insulating material is partially wet etched so that the first nanostructures 20 and the second nanostructures 30 may be formed to be exposed to the outside.

FIG. 12 shows a state in which an electrode 70 is formed on the tops of the first nanostructures 20 and the second nanostructures 30 of FIG. 11.

As shown in FIG. 12, a conductive material is deposited on the tops of the first nanostructures 20 and the second nanostructures 30 to form the electrode 70. A transparent material such as indium tin oxide (ITO) can be used for the electrode 70 so that the sunlight may be well applied. The electrode 70 contacts the tops of the first nanostructures 20 and the tops of the second nanostructures 30 and is thus electrically connected thereto. Therefore, the electromotive force generated by the first nanostructures 20 and the second nanostructures 30 are provided to the outside through the electrodes 70 and 99.

The present invention will now be described in further detail with reference to an experimental example. The experimental example exemplifies the present invention and the present invention is not restricted thereto.

Experimental Example 1

A solar cell is manufactured by using the same experimental method as the described solar cell manufacturing method. A base material is etched and doped to manufacture the first nanostructures and the second nanostructures. Silver nanoparticles are deposited on the base material on which a mask layer is formed by using a mixed solution of $AgNO_3$ of 0.01M and HF of 4.6M. Also, the base material is etched at the speed of 0.5 μm/min by using a mixed solution of HF of 4.6M and $H_2O_2$ of 0.44M. The base material is etched for 120 seconds with potassium hydroxide (KOH) to manufacture the second nanostructures. The first nanostructures are spin-on doped with phosphorus (P) and are then plasma ion doped. The plasma ion doping is performed for 60 seconds by using a 30 ccm $PH_3$ dopant under the condition of a 1 kV DC pulse voltage and 1 kHz RF power. The plasma ion doped first nanostructure is heated at 900° C. for 30 seconds.

Comparative Example 1

For comparing with Experimental Example 1, a substrate made of silicon with a crystallization direction of 001 is provided.

Comparative Example 2

For comparing with Experimental Example 1, a solar cell configured by the first nanostructures is provided. That is, the silver nanoparticles are not used and the mixed solution of HF of 4.6M and $H_2O_2$ of 0.44M is used to etch the base material made of silicon at the speed of 0.5 μm/min and form the first nanostructures on the substrate. Phosphorus is injected into the first nanostructures to be doped.

Comparative Example 3

For comparing with Experimental Example 1, a solar cell configured by the second nanostructures is provided. That is, the mask layer is not used and the silver nanoparticles are deposited on the base material made of silicon by using the mixed solution of $AgNO_3$ of 0.01 M and HF of 4.6M. Also, the base material is etched at the speed of 0.5 µm/min by using the mixed solution of HF of 4.6M and $H_2O_2$ of 0.44M. The base material is etched for 120 seconds with the potassium hydroxide (KOH) to manufacture the second nanostructures. Phosphorus is injected into the second nanostructures to be doped.

Comparative Example 4

For comparing with Experimental Example 1, the solar cell is manufactured by using the same experimental method as Experimental Example 1 except the plasma ion doping method. The solar cell manufactured according to Comparative Example 4 is not plasma ion doped.

Experiment for Observing Structure Photograph

Figure 13:
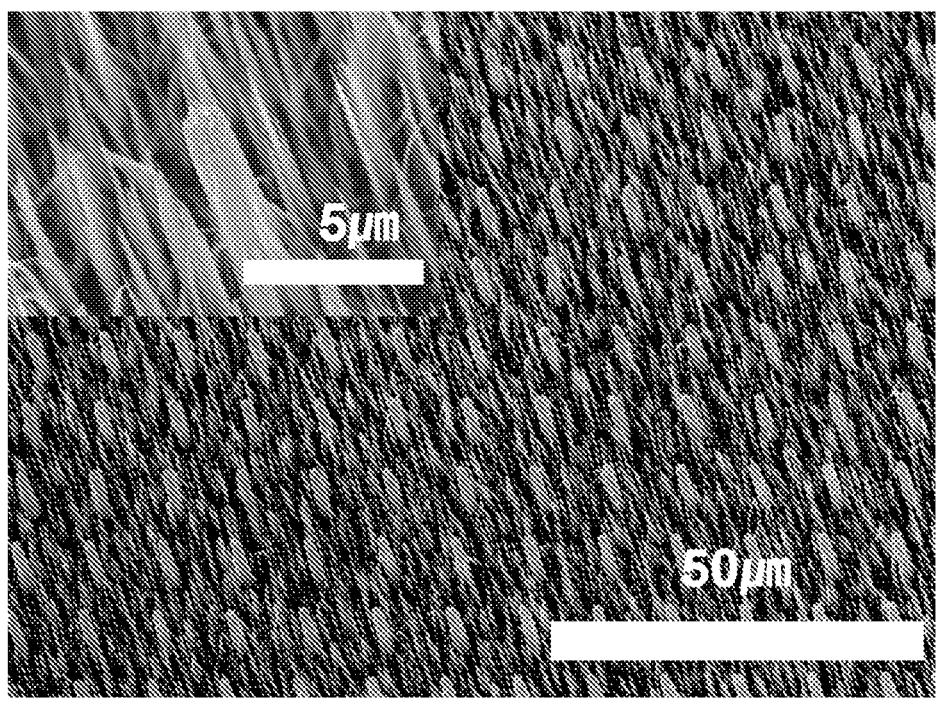
FIG. 13 shows a photograph of a solar cell manufactured by Experimental Example 1 of the present invention taken by scanning electron microscopy.

FIG. 13 shows a photograph of a solar cell manufactured by Experimental Example 1 of the present invention taken by scanning electron microscopy. The top left portion of the photograph of FIG. 13 shows a 10 times enlarged photograph of a solar cell taken by scanning electron microscopy.

As shown in FIG. 13, the first nanostructures and the second nanostructures are formed in the solar cell. The first nanostructures are a tad big and are regularly arranged. The second nanostructures that are smaller than the first nanostructures are formed around the first nanostructures.

Experiment for Measuring Light Reflectivity

The light reflectivity of the solar cell that is manufactured according to the above-described Experimental Example 1 and Comparative Examples 1 to 3 is measured. That is, the light reflectivity of the solar cell following an increase of wavelength of light is measured.

Figure 14:
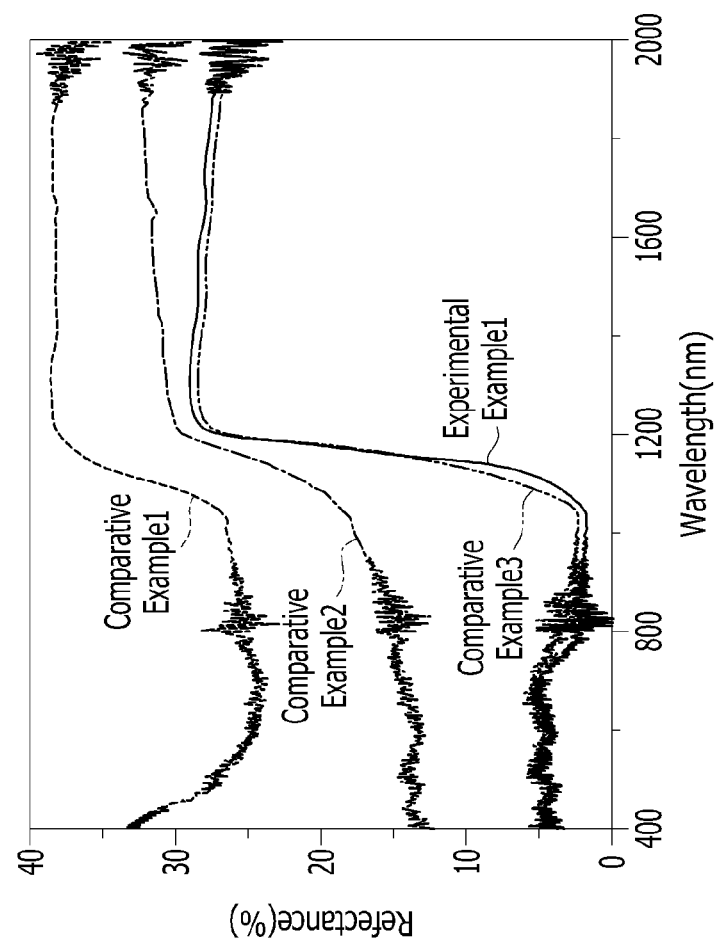
FIG. 14 shows a graph for measuring reflectivity of a solar cell manufactured by Experimental Example 1 and Comparative Examples 1 to 3.

FIG. 14 shows a graph for measuring reflectivity of a solar cell manufactured by Experimental Example 1 and Comparative Examples 1 to 3. The solid line in FIG. 14 indicates Experimental Example 1, the dotted line indicates Comparative Example 1, the one-point chain line indicates Comparative Example 2, and the two-point chain line indicates Comparative Example 3.

In FIG. 13, the optical wavelength of the silicon, the material of the solar cell is substantially 1100 nm so when the optical wavelength substantially exceeds 1100 nm, the light reflectivity of the entire solar cells becomes almost the same. Therefore, the light reflectivity of FIG. 14 is important in an area with the optical wavelength that is less than 1100 nm.

As shown in FIG. 14, the optical reflectivity of the solar cell according to Experimental Example 1 and Comparative Example 3 is the least in the area with the optical wavelength that is less than 1100 nm. The optical reflectivity of the solar cell according to Comparative Example 1 and Comparative Example 2 is greater than the optical reflectivity of the solar cell according to Experimental Example 1 and Comparative Example 3. Therefore, the light absorption rate of the solar cell according to Experimental Example 1 and Comparative Example 3 is found to be the best. Further, the optical reflectivity of the solar cell according to Experimental Example 1 having mixed the first nanostructures and the second nanostructures is not much different from the optical reflectivity of the solar cell according to Comparative Example 3 having the second nanostructures.

Experiment for Photoelectric Conversion

A current volume, a voltage volume, a fill factor (FF) that is a product of voltage and current, and photoelectric conversion efficiency generated by the solar cell of the above-described Experimental Example 1, Comparative Example 2, and Comparative Example 3 are measured. A measured result using the electric field of 1000 W/m² is shown in Table 1.

TABLE 1

| Items | Experimental Example 1 | Comparative Example 2 | Comparative Example 3 |
|---|---|---|---|
| Current volume ($J_{sc}$) | 20.59 mA | 17.04 mA | 17.67 mA |
| Voltage volume ($V_{oc}$) | 500 mV | 521 mV | 520 mV |
| FF | 69.78 | 66.92 | 71.36 |
| Photoelectric conversion efficiency | 7.19% | 5.94% | 6.56% |

As expressed in Table 1, the photoelectric conversion of the solar cell according to Experimental Example 1 is better than that of the solar cell according to Comparative Examples 2 and 3. Therefore, the solar cell according to Experimental Example 1 having combined and used the first nanostructures and the second nanostructures has better photoelectric conversion efficiency than the solar cells according to Comparative Example 2 and Comparative Example 3 having individually used the first nanostructures and the second nanostructures.

Plasma Ion Doping Experiment

Photoelectric conversion efficiency of the solar cell according to Experimental Example 1 and Comparative Example 4 is measured. The results are expressed in Table 2.

TABLE 2

| Items | Experimental Example 1 | Comparative Example 4 |
|---|---|---|
| Current volume ($J_{sc}$) | 24.89 mA | 20.59 mA |
| Voltage volume ($V_{oc}$) | 509 mV | 500 mV |
| FF | 66.75 | 69.78 |
| Photoelectric conversion efficiency | 8.45% | 7.19% |

As expressed in Table 2, the solar cell according to Experimental Example 1 has better photoelectric conversion efficiency than the solar cell according to Comparative Example 4. Therefore, when the solar cell is plasma ion doped, it is checked whether the photoelectric conversion efficiency of the solar cell can be increased. That is, when the plasma ion doping is performed, the doping area of the first nanostructure is formed to be conformal to reduce its band gap and thereby increase the photoelectric conversion efficiency.

Figure 15:
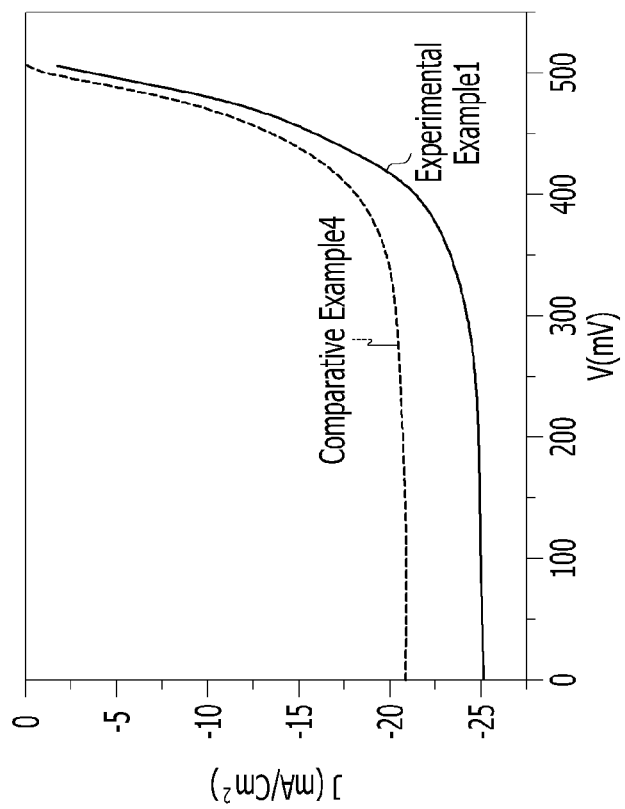
FIG. 15 shows a graph of change of a current volume caused by an increase of a voltage volume of a solar cell manufactured by Experimental Example 1 and Comparative Example 4.

FIG. 15 shows a graph of change of a current volume caused by an increase of voltage volume of a solar cell manufactured by Experimental Example 1 and Comparative Example 4. In FIG. 15, the solid line indicates Experimental Example 1 and the dotted line indicates Comparative Example 4.

As shown in FIG. 15, the current volume of the solar cell according to Experimental Example 1 is greater than that of the solar cell according to Comparative Example 4. Hence, the solar cell according to Experimental Example 1 gathers a much greater amount of carriers and increases the photoelectric conversion efficiency compared to the solar cell according to Comparative Example 4.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A solar cell comprising:
   a substrate having a surface;
   a plurality of first nanostructures provided and arranged on the surface of the substrate such that bottoms of the plurality of first nanostructures are in direct contact with the surface of the substrate; and
   a plurality of second nanostructures provided on the surface of the substrate such that bottoms of the plurality of second nanostructures are in direct contact with the surface of the substrate, and each of the plurality of second nanostructures is arranged to be separate from and independent of the plurality of first nanostructures;
   an insulator provided in a space separated by the plurality of first nanostructures and the plurality of second nanostructures such that tops of the plurality of first nanostructures and tops of the plurality of second nanostructures are exposed above the insulator; and
   an electrode formed on a top of the insulator, the tops of the plurality of first nanostructures, and the tops of the plurality of second nanostructures such that one side of the electrode directly contacts all of the top of the insulator, the tops of the plurality of first nanostructures, and the tops of the plurality of second nanostructures,
   wherein the bottoms and the tops of the plurality of first nanostructures are located on opposite sides of the plurality of first nanostructures and the bottoms and the tops of the plurality of second nanostructures are located on opposite sides of the plurality of second nanostructures,
   wherein each of the plurality of first nanostructures is shaped to have a cylindrical shape of which a diameter is consistent from one end to the other end, and each of the plurality of second nanostructures is shaped to have a cone shape such that exposed surfaces of the first nanostructures and exposed surfaces of the second nanostructures are not in parallel,
   wherein the plurality of first nanostructures and the plurality of second nanostructures are shaped such that an average diameter of a cross-section of each of the plurality of first nanostructures that is in parallel with the surface of the substrate is greater than an average diameter of a cross-section of each of the plurality of second nanostructures that is in parallel with the surface of the substrate.

2. The solar cell of claim 1, wherein each of the plurality of first nanostructures includes a first doping area, and a second doping area surrounding the first doping area in a substrate surface direction of the substrate.

3. The solar cell of claim 2, wherein a diameter of a cross-section of each of the plurality of second nanostructures that is incised in the substrate surface direction of the substrate becomes greater as the cross-section approaches the substrate surface of the substrate.

4. The solar cell of claim 2, wherein the second doping area is formed to be conformal.

5. The solar cell of claim 1, wherein distances between two adjacent first nanostructures of the plurality of first nanostructures are 6 μm to 8 μm.

6. The solar cell of claim 1, wherein a height of each of the plurality of first nanostructures is 5 μm to 100 μm.

7. The solar cell of claim 1, wherein a number of the plurality of second nanostructures is greater than a number of the plurality of first nanostructures.

8. The solar cell of claim 1, wherein a diameter of each of the plurality of first nanostructures is 1000 nm to 2000 nm.

9. The solar cell of claim 1, wherein a diameter of each of the plurality of second nanostructures is 10 nm to 100 nm.

10. The solar cell of claim 1, wherein a sum of surface areas of the plurality of second nanostructures is greater than a sum of surface areas of the plurality of first nanostructures.

11. The solar cell of claim 1, wherein all of the plurality of second nanostructures are not enclosed by the plurality of first nanostructures.

12. The solar cell of claim 1, wherein a surface of each of the plurality of first nanostructures and the plurality of second nanostructures that is not in contact with the surface of the substrate is exposed.

13. The solar cell of claim 1, wherein each of the plurality of first nanostructures is spaced apart from each other such that a plurality of second nanostructures are provided between each first nanostructure.

14. The solar cell of claim 1, wherein the plurality of first nanostructures are arranged in a regular pattern to provide a space on which the plurality of second nanostructures are provided.

15. The solar cell of claim 14, wherein the space is provided between each of the plurality of first nanostructures such that the plurality of second nanostructures are arranged on the surface between each of the plurality of first nanostructures.

* * * * *